United States Patent [19]

Takahashi

[11] Patent Number: 4,581,759
[45] Date of Patent: Apr. 8, 1986

[54] SIGNAL DELAYING DEVICE

[75] Inventor: Katuzi Takahashi, Hamamatsu, Japan

[73] Assignee: Nippon Gakki Seizo Kabushiki Kaisha, Hamamatsu, Japan

[21] Appl. No.: 624,618

[22] Filed: Jun. 26, 1984

[30] Foreign Application Priority Data

Jun. 30, 1983 [JP] Japan ................. 58-119822
Jun. 30, 1983 [JP] Japan ................. 58-119823

[51] Int. Cl.⁴ ............................................. H03G 3/00
[52] U.S. Cl. ........................................ 381/97; 381/56; 381/63; 84/DIG. 26; 84/DIG. 4; 84/1.28; 369/53; 369/60; 360/22
[58] Field of Search ............... 381/56, 119, 62, 63, 381/80, 97; 84/1.24, 1.28, DIG. 4, DIG. 26; 360/22, 23; 369/60, 53; 370/56, 68

[56] References Cited

U.S. PATENT DOCUMENTS

| | | | |
|---|---|---|---|
| 4,177,708 | 12/1979 | Pinz et al. | 84/1.28 |
| 4,185,531 | 1/1980 | Oberheim et al. | 84/1.28 |
| 4,219,880 | 8/1980 | Nichols | 381/63 |
| 4,237,343 | 12/1980 | Kurtin et al. | 381/63 |
| 4,275,267 | 6/1981 | Kurtin et al. | 84/DIG. 26 X |
| 4,348,754 | 9/1982 | Haynes et al. | 369/60 |
| 4,389,915 | 6/1983 | Bione | 381/63 |
| 4,392,405 | 7/1983 | Franz et al. | 84/1.24 |
| 4,479,240 | 10/1984 | McKinley, Jr. | 381/119 |
| 4,533,964 | 8/1985 | Owaki et al. | 360/22 |

Primary Examiner—Forester W. Isen
Attorney, Agent, or Firm—Spensley Horn Jubas & Lubitz

[57] ABSTRACT

A signal delaying device delays a digital signal corresponding to an audio signal. Input signal data is sequentially written into a memory with regularity and data at an address which was written a predetermined period of time before writing of the present data is read out thereby effecting the delay of the signal. In using, the memory is divided into a number corresponding to the number of channels of input signals, that is, the address designation and the manner of control of writing and reading of the memory is changed in accordance with the number of channels of input signals. The delay time of the signal is set by properly setting the predetermined period of time.

4 Claims, 16 Drawing Figures

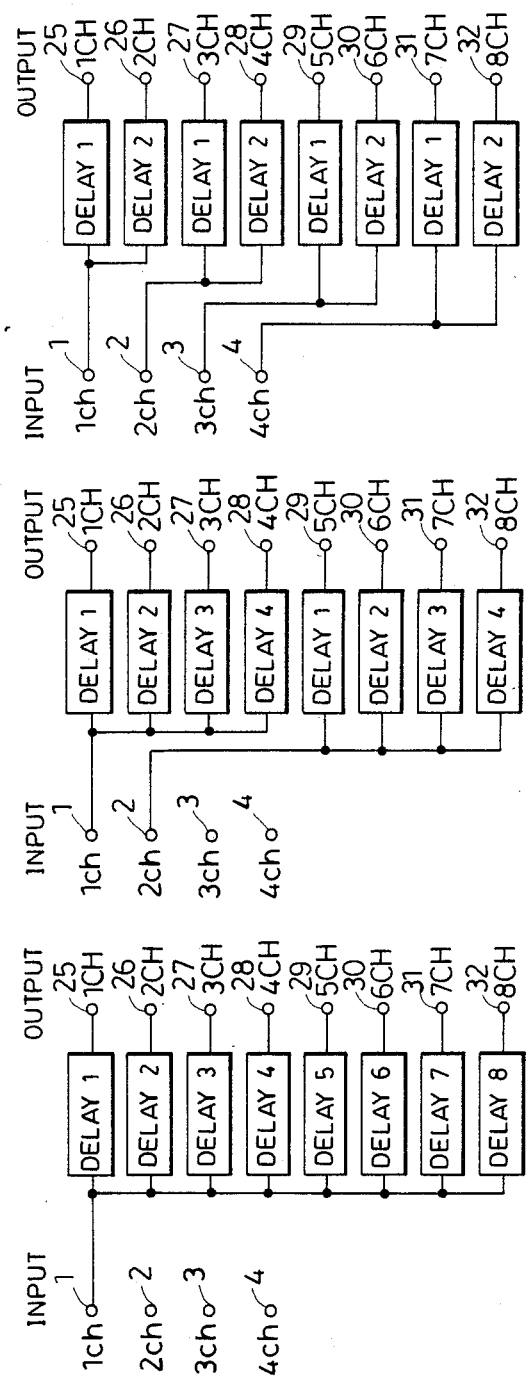

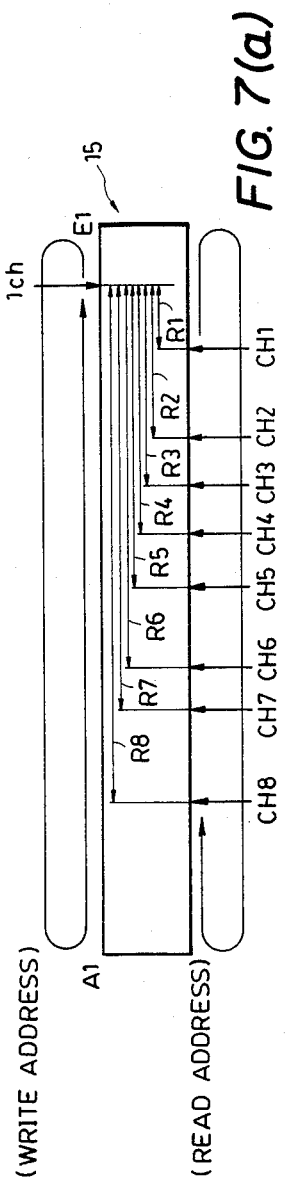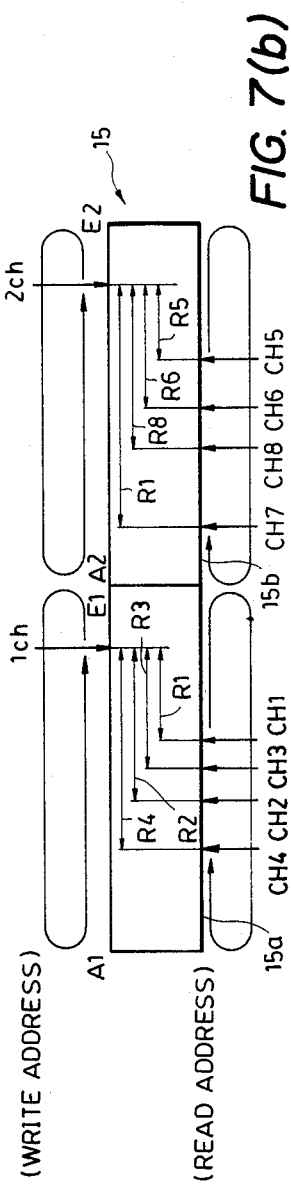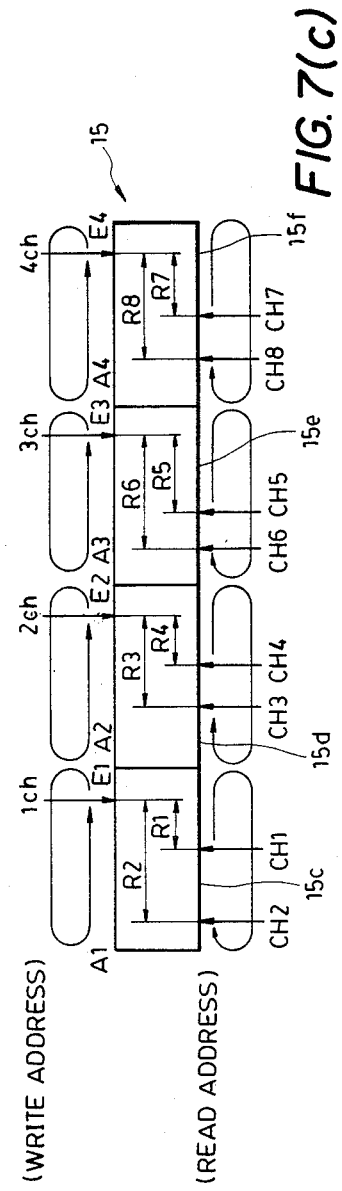

SIGNAL DELAYING DEVICE

BACKGROUND OF THE INVENTION (a) Field of the Invention

This invention relates to a device for delaying a digital signal corresponding to an audio signal and, more particularly, to a device adaptable for various purposes and situations for which the delayed signal is used by using a memory constituting the device upon dividing it into plural memory areas according to the number of channels of input signals.

(b) Description of the Prior Art

The device for delaying a digital signal corresponding to an audio signal is used, for example, for producing an advance signal which is required in effecting cutting of a record disc. In effecting cutting of a record disc, the groove pitch (distance between two adjacent modulated grooves) is varied depending upon the magnitude of level of signals to be recorded for preventing the cutting stylus from reaching a next groove during recording of a high level signal. In effecting the groove pitch control, the groove pitch is adjusted employing an original signal as a signal for checking the level, i.e., the advance signal and thereupon grooves are cut employing a signal obtained by delaying the original signal. And as another example, the signal delaying device is used also in studio recording for delaying tone signals of various musical instruments to be recorded and thereby adjusting the reproduced sound characteristics.

Known in the art of this type of signal delaying device is one which, as shown in FIG. 1(a), has plural output channels CH1 to CHN to a single input so that a suitable delay time can be selected from among various delay times. There is also known a device which, as shown in FIG. 1(b), has a plurality of the channels shown in FIG. 1(a) in the number corresponding to the number of input channels so that it can cope with a plurality of input channels 1ch, 2ch, etc.

These prior art devices, however, have the disadvantage that the delay circuits which are of a fixed construction are not adaptable for various purposes and, as a result, different devices must be provided for different purposes and situations for which the delayed signal is used. In producing the above mentioned advance signal for cutting a record disk, for example, the number of input channels is only two, i.e., right and left channels, but the delay time is a relatively long one of about 1.1 second (standard) so that respective memories constituting the delay circuit must have a relatively large memory capacity. On the other hand, in adjusting the sound characteristics in the studio recording, the delay time may be relatively short (several msec to several tens msec) but the delay time must be controlled for each of various musical instruments so that a signal delay device with a large number of input channels is required.

SUMMARY OF THE INVENTION

It is, therefore, an object of the invention to provide a device for delaying a digital signal which, by a single device, is adaptable for various purposes and situations for which the delayed signal is used.

According to the invention, the device can be adapted for various purposes and situations by using a memory constituting the device upon dividing it into plural memory areas according to the number of input channels. That is, when the number of input channels is small, a relatively large memory area can be allotted to each input channel so that a long delay time which is suitable for, e.g., producing the advance signal is obtained. When only a short delay time is required, the memory area to be allotted to each input channel can be small so that a device with a large number of input channels which is suitable for, e.g., adjusting the sound characteristics in the studio recording is obtained.

BRIEF DESCRIPTION OF THE DRAWINGS

In the accompanying drawings,

FIGS. 5(a), 5(b) and 5(c) show equivalent circuits connecting the inputs through outputs of the device shown in FIG. 2 according to the mode;

FIGS. 7(a), 7(b) and 7(c) each show the relation between the write address and read address in the 1-in mode, 2-in mode and 4-in mode, respectively;

DESCRIPTION OF THE PREFERRED EMBODIMENTS

Preferred embodiments of the invention will now be described with reference to the attached drawings. The embodiments have eight output channels CH1 to CH8 so that by assigning these output channels CH1 to CH8 equally according to the number of input channels, various delayed signals may be obtained for the respective input channels. For example, in the case of a single input channel, eight different delayed signals may be obtained for the input signal (referred to as "1-in mode" below), in the case of two input channels, four different delayed signals may be obtained for the respective input signals (referred to below as "2-in mode"), whereas in the case of four input channels, two delayed signals may be obtained for the respective input signals (referred to below as "4-in mode").

Figure 2:
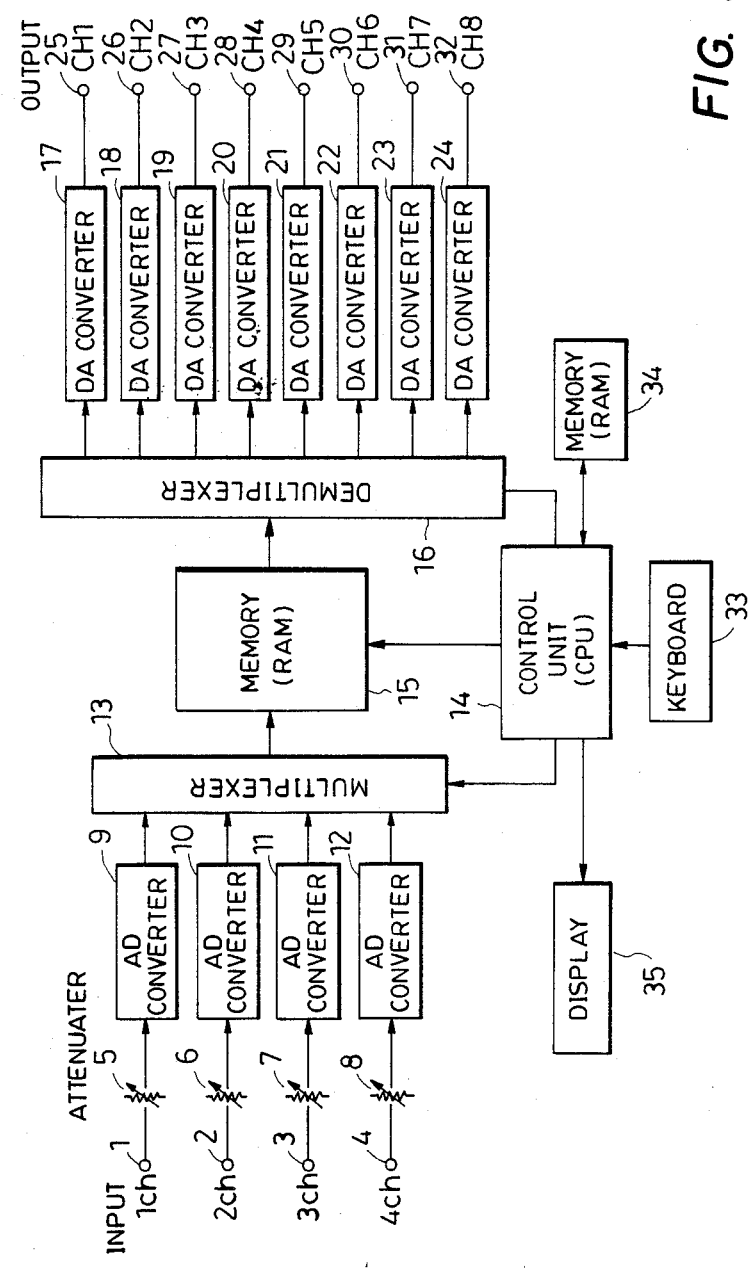
FIG. 2 is a block diagram showing an embodiment of the delaying device of the invention.

FIG. 2 shows an entire structure of an embodiment of the signal delaying device to which the invention is applied. This device is provided with four input channels 1ch to 4ch. Audio signals applied to input terminals 1 to 4 are provided through attenuaters 5 to 8 to A–D converters 9 to 12, where these signals are converted into digital signals before being applied to a multiplexer 13. Upon receipt of the instruction from a control unit (CPU) 14, the multiplexer 13 multiplexes, in accordance with a mode employed, the input data of the respective input channels 1ch to 4ch in response to a given clock and delivers out the multiplexed data. In the case of 1-in mode, for example, one sample of the input channel (e.g., the first input channel 1ch) is produced every one clock (corresponding to one sampling period of the A-D converters 9 to 12). In the case of the 2-in mode, one sample of each of two input channels (e.g., the first and second input channels) is produced in order every one clock. In the case of the 4-in mode, one sample of each of all the input channels 1ch to 4ch is produced in order every one clock.

Data from the multiplexer 13 is applied to a memory (RAM) 15 forming the delay circuit. In response to the instruction by the control unit 14, the area of the memory 15 is divided according to the number of input channels of a mode employed. More specifically, in the case of the 1-in mode, all the addresses of the memory 15 are used for one specific input channel (e.g., 1ch) without dividing the memory area, whereas in the case of the 2-in mode, the memory area is divided into two, which are used for the respective input channels (e.g., 1ch, 2ch). Similarly in the case of the 4-in mode, the memory area is divided into four, which are used for all the input signals 1ch to 4ch, respectively. Therefore, if the memory 15 has, for example, a capacity of 64K words, each input channel is assigned 64K words in the 1-in mode, 32K words in the 2-in mode, and 16K words in the 4-in mode. In response to the write address instruction by the control unit, the data of the respective input channels applied to the memory 15 are sorted and written into the assigned areas in order. The write address circulates in the respective areas so that old data is successively rewritten into new data. If, therefore, the writing clock frequency is 40 kHz, maximum delay times obtained in the respective modes are:

In the 1-in mode: 64K words/40 kHz = 1.6 sec
In the 2-in mode: 32K words/40 kHz = 0.8 sec
In the 4-in mode: 16K words/40 kHz = 0.4 sec The data written into the memory 15 is read out in order in response to the instruction from the control unit 14. At this time, by staggering the read address in relation to the write address, delay data is obtained. The reading operation is carried out in synchronism with the writing operation.

Figure 1A:
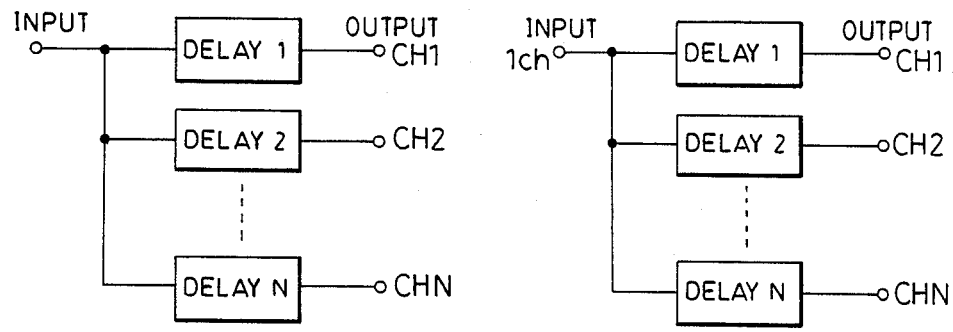
FIGS. 1(a) and 1(b) are block diagrams each showing the structure of known digital delaying circuit.
Figure 1B:
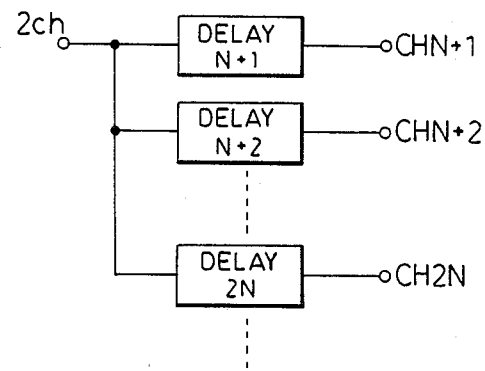
Figure 3:
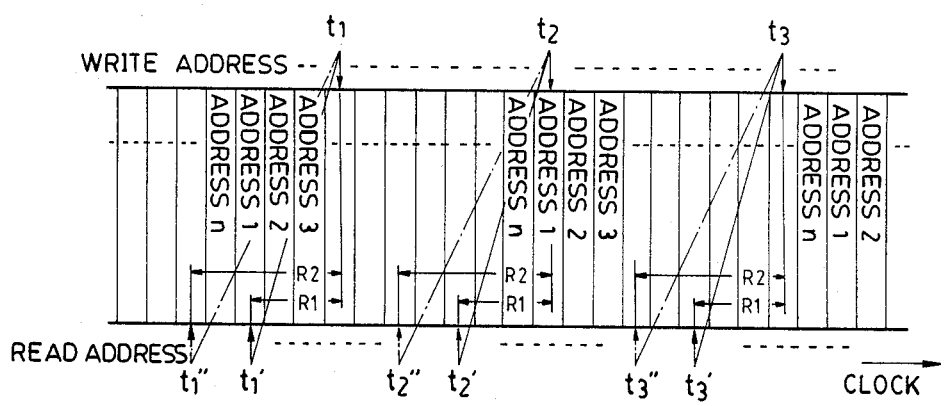
FIG. 3 shows the relation between the write address and the read address in each divisional memory area in the device shown in FIG. 2.

FIG. 3 shows the relation between the write address and the read address in one divisional memory area (address 1 to address n). Writing is executed by circulating through the memory area of the address 1 to address n, thereby rewriting the old data into new data. Assuming that a delay time R1 is provided, when data is written at a clock $t_1$, the data which was written into an address at a clock $t_1'$ is read out. When data is written into an address at a clock $t_2$, the data which was written into an address at a clock $t_2'$ is read out. When data is written into an address at a clock $t_3$, the data which was written into an address at a clock $t_3'$ is read out. Thus, the write address and the read address are shifted successively with a constant time lag R1 between them. Where two different delay data are to be obtained for a signal on one input channel, another delay time R2 is additionally provided so that, as shown by a chain-dot line in FIG. 3, when data is written at the clocks $t_1$, $t_2$, $t_3$, ..., the data that were written at clocks $t_1''$, $t_2''$, $t_3''$, ... are additionally read out, respectively. By providing more delay times, the number of different delay data obtained for a signal on one input channel may be increased.

Referring to FIG. 2, the data that is read out from the memory 15 is applied to a demultiplexer 16, which sorts out and distributes every delay data among the output channels CH1 to CH8 in response to the instruction from the control unit 14. The delay data distributed among the output channels CH1 to CH8 are converted to the original audio signals through D-A converters 17 to 24 and led to respective channel outputs 25 to 32.

Figure 4A:
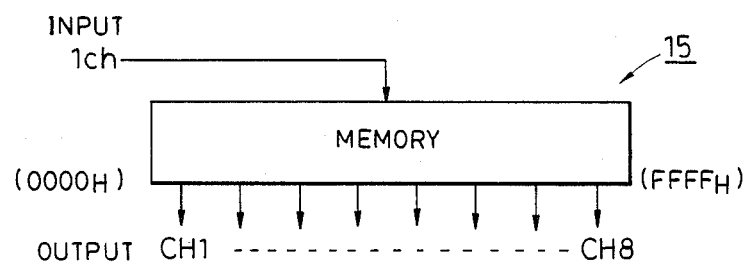
FIGS. 4(a), 4(b) and 4(c) show how the memory shown in FIG. 2 is divided according to the mode.
Figure 4B:
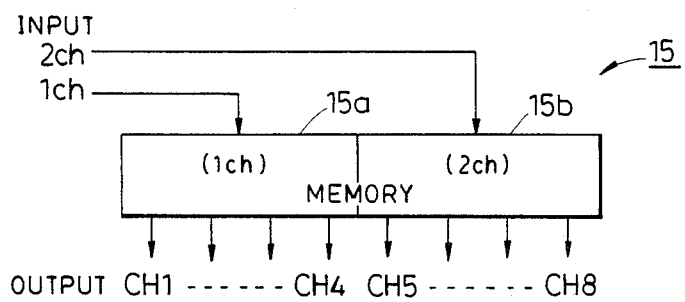
Figure 4C:
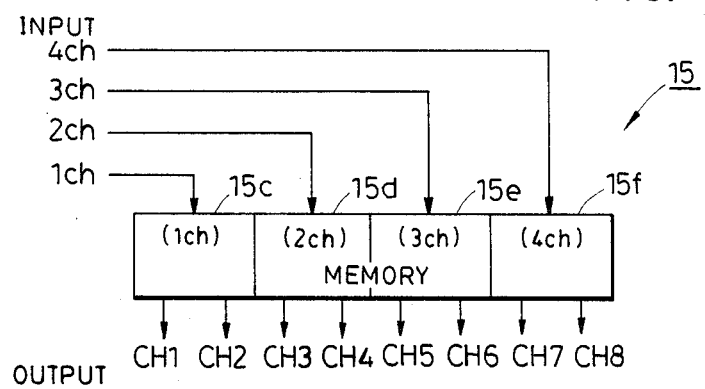

FIGS. 4(a), 4(b), and 4(c) show how the memory 15 is divided in the respective modes, illustrating the output channels CH1 to CH8 as assigned to the divisional areas of the memory 15. FIG. 4(a) shows the case of 1-in mode, in which one input channel 1ch is assigned the entire area of the memory 15. Also, all of the eight output channels CH1 to CH8 are assigned to the input channel 1ch so that a maximum of eight different delayed signals may be obtained for the input signal on the input channel 1ch. FIG. 4(b) shows the case of the 2-in mode, wherein the memory 15 is divided into two areas 15a, and 15b which are assigned to the input channels 1ch, and 2ch, respectively. The output channels CH1 to CH8 also are divided into two groups so that the output channels CH1 to CH4 are assigned to the input channel 1ch while CH5 to CH8 are assigned to the input channel 2ch. In the case of the 2-in mode, therefore, a maximum of four different delayed signals may be obtained for the input signal on each of the input channels 1ch and 2ch. FIG. 4(c) shows the case of the 4-in mode, wherein the memory 15 is divided into four areas 15c, 15d, 15e, and 15f, which are assigned the input channels 1ch to 4ch, respectively. The output channels CH1 to CH8 also are divided into four groups so that the output channels CH1, and CH2 are assigned to the input channel 1ch, the output channels CH3 and CH4 are assigned to the input channel 2ch, the output channels CH5 and CH6 are assigned to the input channel 3ch, and the output channels CH7 and CH8 are assigned to the input channel 4ch, respectively. In the case of the 4-in mode, therefore, a maximum of two different delayed signals may be obtained for each of the input signals on the respective input channels 1ch to 4ch.

The input-output connections in these modes may be expressed equivalently as in FIGS. 5(a), 5(b), and 5(c), respectively. FIG. 5(a) shows the case of the 1-in mode, 5(b) the 2-in mode and 5(c) the 4-in mode. The 1-in mode is equivalent to eight delay elements being provided for one input channel, the 2-in mode is equivalent to four delay elements being provided for each of the input channels 1ch and 2ch and the 4-in mode is equivalent to two delay elements being provided for each of the four input channels 1ch to 4ch. Thus, in the delay device shown in FIG. 2, various combinations of the number of input channels and the delay times are possible.

Referring to FIG. 2, a keyboard 33 is used to perform functions including selecting the mode and setting the delay times (which may be set separately for each of the output channels CH1 to CH8). A memory (RAM) 34 is used to store programs for processing in addition to the set delay time. A display device 35 displays the selected mode, the connection between the input channels 1ch to 4ch and the output channels CH1 to CH8, the delay times on the output channels CH1 to CH8, and the like in a manner shown, for example, in FIG. 5 whereby the present operation may be understood at a glance.

Figure 6:
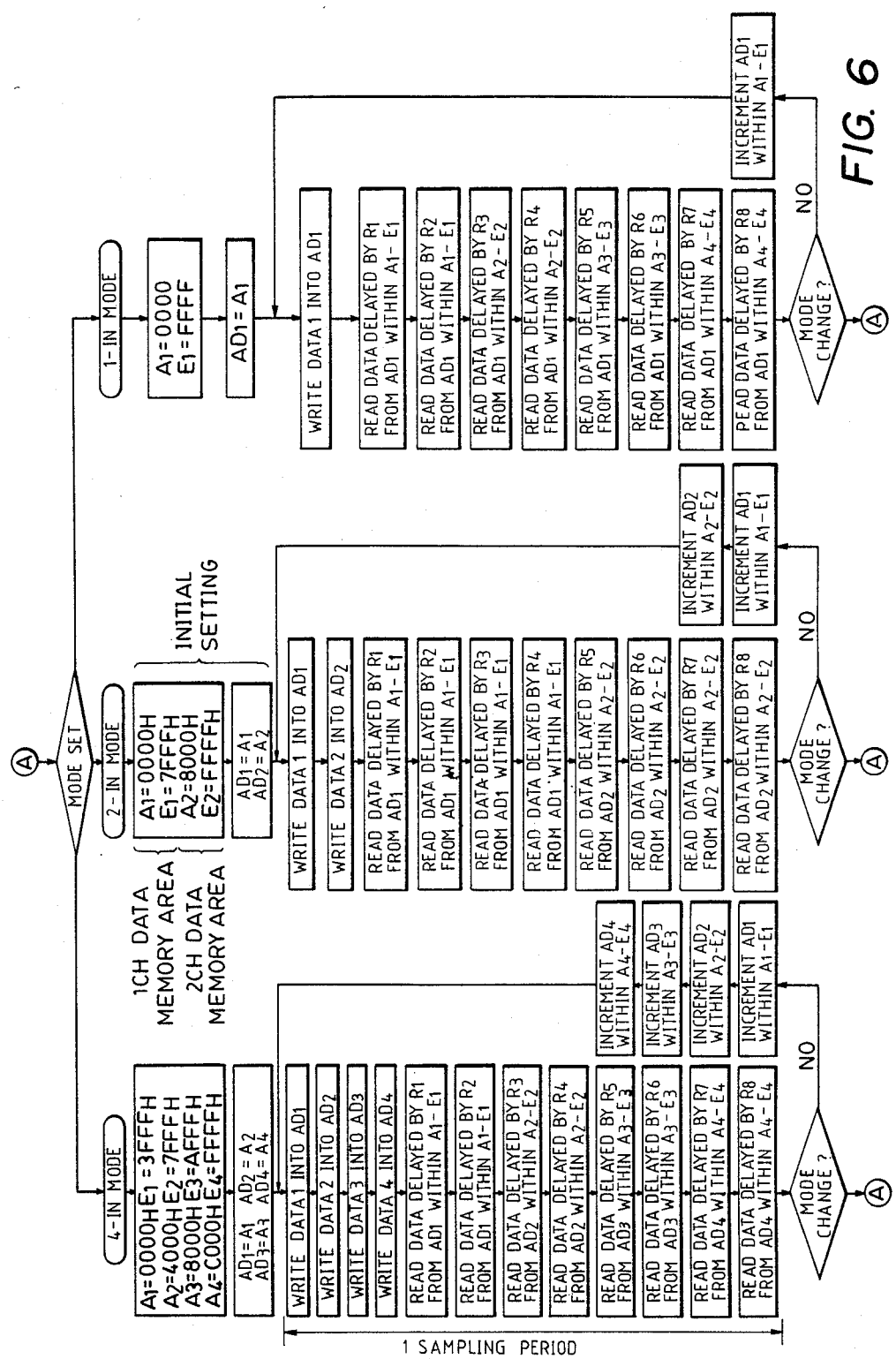
FIG. 6 is a flow chart showing the operation of the device shown in FIG. 2 according to the mode.

The signal delay operation performed by the delaying device shown in FIG. 2 will be described below referring to the flow chart shown in FIG. 6.

Prior to the start of the operation, a mode is selected and delay times R1 to R8 are set in the respective output channels CH1 to CH8.

Upon selection of the mode, the control unit 14 divides the memory 15 by calculating the initial and the end addresses of each divisional area according to the selected mode. Given below are the calculated numerical values supposing the memory 15 has the whole area of $0000_H$ to $FFFF_H$ (in sexadecimal).

| the whole area of memory 15 | $0000_H \sim FFFF_H$ | | | |
|---|---|---|---|---|
| 1-in mode | $A1 = 0000_H$ $E1 = FFFF_H$ | | | |
| 2-in mode | first memory area 15a | | second memory area 15b | |
|  | $A1 = 0000_H$ $E1 = 7FFF_H$ | | $A2 = 8000_H$ $E2 = FFFF_H$ | |
| 4-in mode | first memory area 15c | second memory area 15d | third memory area 15e | fourth memory area 15f |
|  | $A1 = 0000_H$ $E1 = 3FFF_H$ | $A2 = 4000_H$ $E2 = 7FFF_H$ | $A3 = 8000_H$ $E3 = BFFF_H$ | $A4 = C000_H$ $E4 = FFFF_H$ |

An (n = 1, 2, 3, 4): the initial address of the n-th memory area
En (n = 1, 2, 3, 4): the end address of the n-th memory area Because each of the delay times R1 to R8 is of a length not exceeding the time in which one cycle of the writing operation is completed throughout each memory area, a maximum length of delay time available varies according to the dimension of the memory area such that a maximum lengths of delay times available in the 2-in mode and the 4-in mode are ½ and ¼ times as long as that in the 1-in mode, respectively, as previously mentioned.

The signal delay operations in the respective modes will now be more specifically described. FIG. 7 shows the relation between the write address and the read address in each mode.

(1) 1-in mode (FIG. 7(a))

Where the 1-in mode has been selected, the memory 15 is not divided and the writing and reading are executed starting from the initial address A1 throughout the whole area of the memory 15. The read address may be obtained by calculating the address distance from the present write address AD1 according to the preset delay times R1 to R8. The read data is demultiplexed and delivered out. Each time one set of writing and reading is completed (this one loop corresponds to one sampling period), the present address AD1 is advanced by one address until the end address E1, from which it returns to the initial address to repeat the operation.

(2) 2-in mode (FIG. 7(b))

Where the 2-in mode has been selected, the data on the input channels 1ch and 2ch is stored, upon being multiplexed, in each of the halved areas of the memory 15, starting from the initial addresses A1 and A2. The reading is carried out by accessing the addresses obtained by calculation based on the delay times R1 to R4 respectively provided as from the present address AD1 in the first memory area 15a for output channels CH1 to CH4 and by accessing the addresses obtained by calculation based on the delay times R5 to R8 as set respectively from the present address AD2 in the second memory area 15b for the output channels CH5 to CH8. Every time one set of writing and reading is completed in the respective areas 15a, and 15b (in this case also, one loop corresponds to one sampling period), the present addresses AD1, and AD2 are advanced by one address each to repeat the operation. When the present addresses AD1, and AD2 are through with the end addresses E1, and E2, they return to the initial addresses A1, and A2 to repeat the operation.

(3) 4-in mode (FIG. 7(c))

Where the 4-in mode has been selected, the data on the input channels 1ch, 2ch, 3ch, and 4ch is stored, upon being multiplexed, in the respective areas 15c to 15f of the quartered memory 15, starting from the initial addresses A1, A2, A3, and A4. The reading is carried out by accessing the addresses obtained by calculation based on the delay times R1, and R2 as provided respectively from the present address AD1 in the first memory area 15c for the output channels CH1, and CH2, by accessing the addresses obtained by calculation based on the delay times R3, and R4 respectively provided as from the present address AD2 in the second memory area 15d for the output channels CH3, and CH4, by accessing the addresses obtained by calculation based on the delay times R5, and R6 respectively provided as from the present address AD3 in the third memory area 15e for the output channels CH5, and CH6, and by accessing the addresses obtained by calculation based on the delay times R7, and R8 provided as respectively from the present address AD4 in the fourth memory area 15f for the output channels CH7, and CH8. Each time one set of the writing and reading operation is completed in the respective areas 15c to 15f (in this case also, one loop corresponds to one sampling period), the present addresses AD1, AD2, AD3, and AD4 advance by one address and the same operation is repeated. When the present addresses AD1, AD2, AD3, and AD4 are through with t-e end addresses E1, E2, E3, and E4 in the respective areas, they return to the initial addresses A1, A2, A3, and A4 to repeat the same operation.

Although in this embodiment, the memory 15 is divided equally according to the number of input channels, where the necessary delay time varies with the input channel, the input channels may be each assigned memory areas which vary in measure according to the length of delay time required.

As described above, since the memory area is divided according to the number of input channels in using the memory, various combinations of the number of input channels and the delay times can be realized whereby the device can be adapted for various purposes and situations.

Another embodiment of the signal delaying device according to the invention will now be described with reference to FIG. 8. In this signal delaying device, a monitor circuit for checking the delay effect is added to the signal delaying device shown in FIG. 2.

When a signal delaying device is used for achieving a desired sound characteristics in a studio or a hall, there arises necessity for checking whether or not a set delay is really being effected in the actual state of use of the device. If there is an apparent time lag between an original sound and a delayed signal and the sounding sources are located near to the ears, it will be possible to discriminate the original sound from the delayed signal by directly hearing the sound reproduced. The delay time, however, is often set at a very short period of time of several msec to several tens msec so that it is very difficult to directly identify the delay effect. Further, the sound sources are located often far from the ears, and it is also difficult to directly identify the delay effect because the influence of the distance between the sound source and the ears on the delay time increases with the distance. For these reasons, there arises necessity for some device to overcome this problem.

Figure 8:
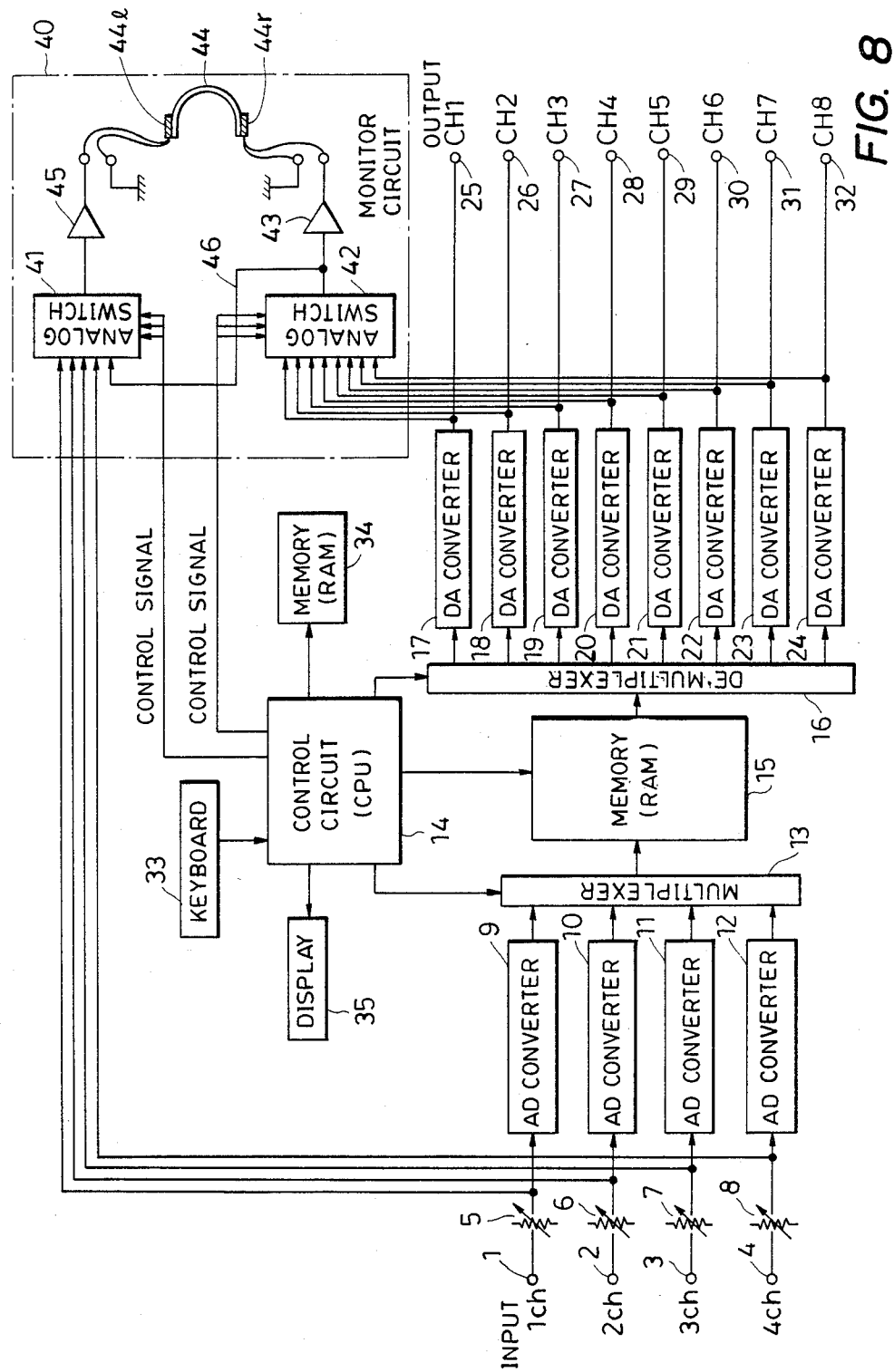
FIG. 8 is a block diagram showing an embodiment in which a monitor circuit 40 for checking the delay effect is added to the embodiment shown in FIG. 2.

In order to meet such necessity, a monitor circuit 40 (enclosed by a chain and dot line) capable of clearly confirming the slightest delay time is additionally provided in the signal delaying device in FIG. 8.

In FIG. 8, the same component parts as in FIG. 2 are designated by the same reference characters and description thereof will be omitted.

The monitor circuit 40 is supplied with the signals on the input channels 1ch to 4ch yet to be delayed and the delayed signals on the output channels CH1 to CH8. These signals yet to be delayed are applied to an analog switch 41 while the delayed signals are applied to an analog switch 42. To monitor the signals, one of the output channels to be monitored is selected by a keyboard 33. Then the control unit 14 produces a control signal whereby the corresponding switch of the analog switch 42 is closed so that the delayed signal on that output channel is produced from the analog switch 42. This delayed signal is supplied through an amplifier 43 to the right channel unit 44r of headphone 44. At this time, selection in the analog switch 41 is made automatically. That is, since, as mentioned above, the input channels 1ch to 4ch are connected to the output channels CH1 to CH8 in such a manner that the connection is invariably predetermined according to the mode used, the control unit 14 specifies the input channels according to the selection of the mode and the output channel to be monitored in a manner as shown in the table below and produces the control signal to close the corresponding switch of the switch 41, thereby producing the signal on the pertinent input channel (original signal).

| mode | monitored channel | | | | | | | |
|---|---|---|---|---|---|---|---|---|
| | CH1 | CH2 | CH3 | CH4 | CH5 | CH6 | CH7 | CH8 |
| 1-in mode | | | | 1ch | | | | |
| 2-in mode | | 1ch | | | | | 2ch | |
| 4-in mode | 1ch | | 2ch | | | 3ch | | 4ch |

Figure 9:
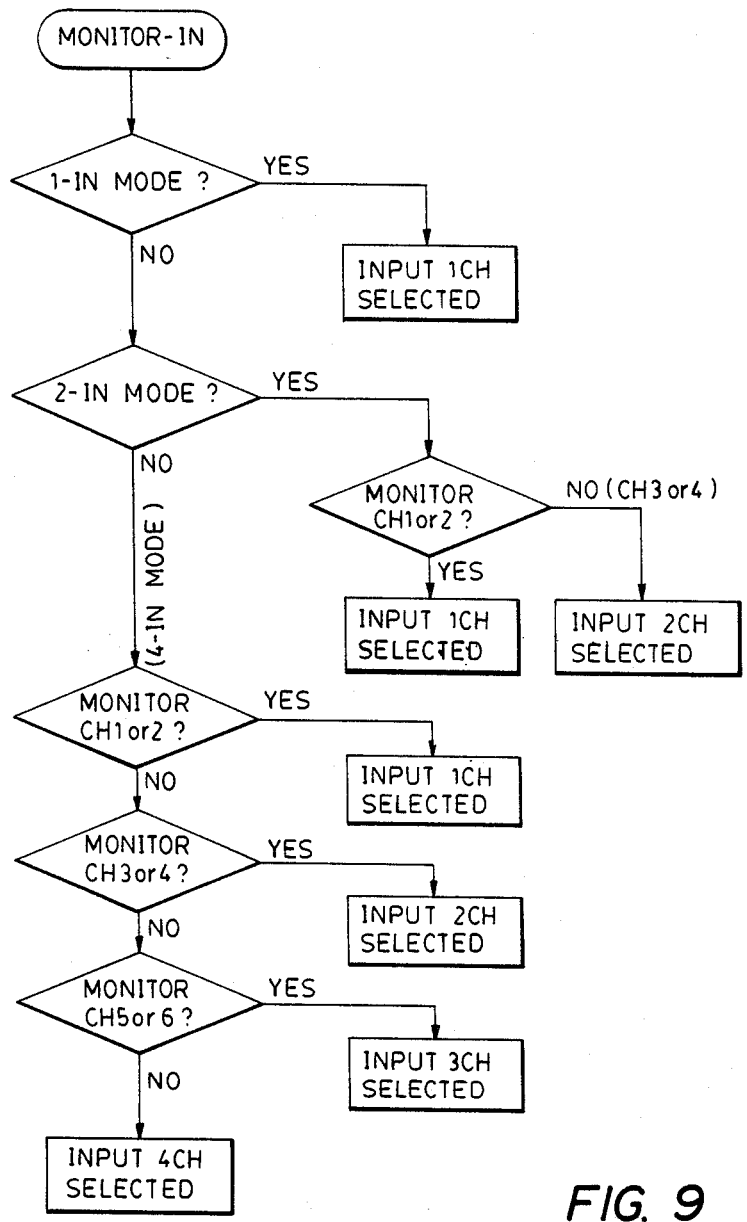
FIG. 9 is a flow chart showing the input channel selection operation in the control unit 14 shown in FIG. 8 at the time of monitoring.

The input channel switching operation by the control unit 14 is made possible by constructing the logic shown in FIG. 9 by software.

The original signal produced from the analog switch 41 is supplied through an amplifier 45 to the left channel unit 44l of headphone 44. Therefore, the headphone 44 is supplied at its right channel unit 44r with the delayed signal on the output channel selected and at its left channel unit 44l with the corresponding original signal. Thus the delay effect may be confirmed because of the time lag created between the respective sounds heard by the right and left ears. Especially since the sound travels but a short distance from its source to the ears and therefore suffers little influence on the delay time due to the distance, a time lag obtained by even a very short delay time (several msec to tens of msec) may be clearly distinguished.

In addition to the monitoring method whereby the right and left headphone units 44r and 44l are each provided with the original signal and the delayed signal, respectively (in/out method), another monitoring method is available to the signal delaying device shown in FIG. 8, whereby the right and left headphone units 44r and 44l are both provided with a delayed signal (mono method). The choice between these monitoring methods is made by means of the keyboard 33. If the mono method is chosen, the analog switch 41 selects the delayed signal supplied from a signal line 46 in response to the control signal from the control unit 14, thereby providing the delayed signal to both right and left headphone units 44r and 44l.

Since in this embodiment the original signal and the delayed signal are sounded near the right and left ears respectively by means of the headphone units, the influence of the distance between the sound source and the ears on the delay time is eliminated and the time lag obtained by even a very short delay time may be clearly distinguished.

What is claimed is:
1. A signal delaying device comprising:
a plurality of input terminals respectively receiving analog input signals of respective channels;
a plurality of A-D converting means connected respectively to said respective input terminals and converting the input signals applied to said input terminals to digital signals;
a multiplexer receiving output signals of said plurality of A-D converting means and outputting serial data of a single channel;
memory means for sequentially storing the output signal data of said multiplexer and having plural addresses that are accessed in circulating order at a certain rate, the output signal data of said multiplexer being sequentially written at a predetermined period into the address then being accessed and as each such writing is carried out data is read out from the address where a writing operation was done a predetermined period of time before the present writing is done;
a demultiplexer demultiplexing serial data sequentially read out from the respective addresses of said memory means into signals of plural channels;
a plurality of D-A converting means for converting the demultiplexed digital signals of the respective channels into analog signals;
a plurality of output terminals connected to outputs of said D-A converting means from which the analog signals of the respective channels are derived as output signals;
control means for effecting designation of addresses and writing and reading operations of said memory means; and
mode designation means for setting the number of channels of input signals to be processed, said control means being set in response to setting of the number of channels in such a manner that the address space of said memory means will be divided in use according to the set number of channels of input signals.

2. A signal delaying device as defined in claim 1 wherein the write address and the read address are sequentially incremented with regularity whereby the interval between these addresses for the respective channels is always set at a constant value.

3. A signal delaying device as defined in claim 2 wherein the delay time can be variably set by variably setting the address interval between the write address and the read address of said memory means.

4. A signal delaying device as defined in claim 1 further comprising a monitor circuit having headphone units one of which receives and reproduces an original signal and the other of which receives and reproduces a delayed version of the original signal.

* * * * *